US010283714B2

(12) United States Patent
Lu et al.

(10) Patent No.: US 10,283,714 B2
(45) Date of Patent: May 7, 2019

(54) ORGANIC ELECTROLUMINESCENT MATERIAL CONTAINING ALKALINE EARTH METAL BASED METAL-ORGANIC FRAMEWORKS AND ORGANIC ELECTROLUMINESCENT DEVICE USING THE SAME

(71) Applicants: ACADEMIA SINICA, Taipei (TW); National Taiwan University, Taipei (TW)

(72) Inventors: Kuang-Lieh Lu, Taipei (TW); Muhammad Usman, Taipei (TW); Yang-Fang Chen, Taipei (TW); Golam Haider, Taipei (TW); Shruti Mendiratta, Taipei (TW); Tzuoo-Tsair Luo, Taipei (TW)

(73) Assignees: ACADEMIA SINICA, Taipei (TW); NATIONAL TAIWAN UNIVERSITY, Taipei (TW)

( * ) Notice: Subject to any disclaimer, the term of this patent is extended or adjusted under 35 U.S.C. 154(b) by 251 days.

(21) Appl. No.: 15/421,221

(22) Filed: Jan. 31, 2017

(65) Prior Publication Data
US 2017/0229652 A1   Aug. 10, 2017

(30) Foreign Application Priority Data

Feb. 5, 2016   (CN) .......................... 2016 1 0083285

(51) Int. Cl.
*H01L 51/54* (2006.01)
*C09K 11/06* (2006.01)
*H01L 51/00* (2006.01)
*C08G 79/00* (2006.01)
*H01L 51/52* (2006.01)
*H01L 51/50* (2006.01)

(52) U.S. Cl.
CPC .......... *H01L 51/0035* (2013.01); *C08G 79/00* (2013.01); *C09K 11/06* (2013.01);
(Continued)

(58) Field of Classification Search
CPC .... C08G 79/00; C09K 11/06; C09K 2211/00; C09K 2211/10; C09K 2211/1416;
(Continued)

(56) References Cited

U.S. PATENT DOCUMENTS 6,686,691 B1   2/2004   Mueller et al.
7,229,571 B2   6/2007   Ezuhara et al.

OTHER PUBLICATIONS

Irena Senkovska, "New coordination polymers based on naphthalene-1,4,5,8-tetracarboxylate hydrates of Ca, Sr, and Ba", Zeitschrift fur Naturforschung B: A Journal of Chemical Sciences, 2006, 61 (11), pp. 1383-1390.

(Continued)

*Primary Examiner* — Andrew K Bohaty
(74) *Attorney, Agent, or Firm* — Muncy, Geissler, Olds & Lowe, P.C.

(57) ABSTRACT

An organic electroluminescent material is shown in the following general formula (1), $$\{[M(L)(H_2O)_x].(H_2O)_y\}_n \qquad \text{General Formula (1)}$$

wherein x is between 1 and 4, y is between 1 and 8, and n is a positive integer. M is any one selected from the group consisting of beryllium (Be), strontium (Sr), and radium (Ra). L is an organic ligand containing a naphthalene group and an anhydride group. M and L form metal-organic frameworks. An organic electroluminescent device containing the organic electroluminescent material is also disclosed.

13 Claims, 5 Drawing Sheets

(52) U.S. Cl.
CPC ........ *H01L 51/004* (2013.01); *H01L 51/0077* (2013.01); *H01L 51/5206* (2013.01); *H01L 51/5234* (2013.01); *C09K 2211/1416* (2013.01); *C09K 2211/181* (2013.01); *H01L 51/5012* (2013.01); *H01L 51/5072* (2013.01); *H01L 2251/301* (2013.01)

(58) Field of Classification Search
CPC .......... C09K 2211/181; H01L 51/0032; H01L 51/0035; H01L 51/004; H01L 51/0077; H01L 51/50; H01L 51/5012; H01L 51/5072; H01L 51/5206; H01L 51/5234; H01L 2251/301
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

OTHER PUBLICATIONS

Nielsen et al., "Syntheses, crystal structures and thermal properties of 3D coordination polymers assembled from 1,4,5,8-naphthalenetetracarboxylic acid," Solid State Sciences, 8 (2006) pp. 1237-1242.

ORGANIC ELECTROLUMINESCENT MATERIAL CONTAINING ALKALINE EARTH METAL BASED METAL-ORGANIC FRAMEWORKS AND ORGANIC ELECTROLUMINESCENT DEVICE USING THE SAME

CROSS REFERENCE TO RELATED APPLICATIONS

This Non-provisional application claims priority under 35 U.S.C. § 119(a) on Patent Application No(s). 201610083285.9 filed in People's Republic of China on Feb. 5, 2016, the entire contents of which are hereby incorporated by reference.

BACKGROUND OF THE INVENTION

Field of Invention

The present invention relates to an organic electroluminescent material and an organic electroluminescent device. In particular, the present invention relates to an organic electroluminescent material containing alkaline earth metal based metal-organic frameworks and an organic electroluminescent device using the same.

Related Art

With the advances in electronic technology, a light weight and high efficiency flat display device has been developed. An organic electroluminescent device possibly becomes the mainstream of the next generation flat panel display device due to its advantages of self-luminosity, no restriction on viewing angle, power conservation, simple manufacturing process, low cost, high response speed, full color and so on.

In general, the organic electroluminescent device includes an anode, an organic luminescent layer and a cathode. When applying a direct current to the organic electroluminescent device, electron holes and electrons are injected into the organic luminescent layer from the anode and the cathode, respectively. Charge carriers move and then recombine in the organic luminescent layer because of the potential difference caused by an applied electric field. The excitons generated by the recombination of the electrons and the electron holes may excite the luminescent molecules in the organic luminescent layer. The excited luminescent molecules then release the energy in the form of light. Currently, the white light emitting diodes (WLEDs) are the most potential products in market.

There are two major lighting theories for the white light emitting diodes. U.S. Pat. No. 6,686,691 discloses a white light emitting diode applying one of the theories, which utilizes red, blue and green light materials to generate the white light. In addition, U.S. Pat. No. 7,229,571 discloses a white light emitting diode applying the other theory, which utilizes a blue light luminescent material mixing with yellow phosphor to generate the white light.

However, the above-mentioned theories need to critically control the ratios of the materials of different colors during the manufacturing process for preparing the luminescent device capable of emitting white light. In other words, the manufacturing processes according to the above-mentioned theories must be performed very carefully. Besides, the white light is generated by mixing red, blue and green lights or yellow and blue lights, it may not completely reproduce the natural sunlight, which is more comfortable for human eyes. Moreover, these luminescent materials may need the additional lanthanide metals, which are rare materials and very expansive.

Accordingly, it is desired to provide an organic electroluminescent material containing alkaline earth metal based metal-organic frameworks and an organic electroluminescent device using the same, which can be manufactured by a single material and applied to high performance organic light emitting device.

SUMMARY OF THE INVENTION

In view of the foregoing, an objective of the present invention is to provide an organic electroluminescent material containing alkaline earth metal based metal-organic frameworks and an organic electroluminescent device using the same, which can be manufactured by a single material, have good thermal stability, can emit light similar to the natural sun light and comfortable to human eyes, and can be applied to high performance organic light emitting device.

To achieve the above objective, the present invention discloses an organic electroluminescent material having a structure of the following General Formula (1), $$\{[M(L)(H_2O)_x] \cdot (H_2O)_y\}_n \quad \text{General Formula (1)}$$

Wherein, x is between 1 and 4, y is between 1 and 8, n is a positive integer, and M is any one selected from a group consisting of beryllium (Be), strontium (Sr), and radium (Ra). L is selected from a group consisting of a General Formula (2), a General Formula (3) and a General Formula (4):

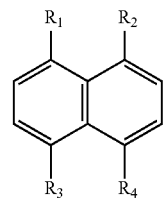

General Formula (2)

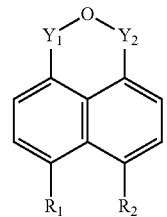

General Formula (3)

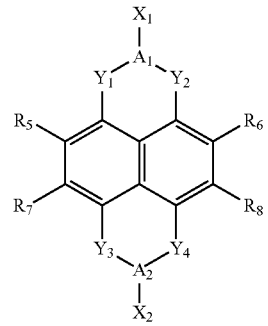

General Formula (4)

Wherein, $R_1$, $R_2$, $R_3$ and $R_4$ are each independently a carboxylic group. $Y_1$, $Y_2$, $Y_3$ and $Y_4$ are each independently a carbonyl group. $A_1$ and $A_2$ are each independently an oxygen atom (O) or a nitrogen atom (N). $R_5$, $R_6$, $R_7$ and $R_8$ are each independently selected from a group consisting of a hydrogen atom (H), a fluorine atom (F), a chlorine atom (Cl), a bromine atom (Br), a cyano group (CN), an alkylthio group (SR), a hydroxyl group (OH), and an alkoxy group (OR). $X_1$ and $X_2$ are each independently selected from a group consisting of a hydrogen atom (H), a hydroxyl group (OH), a substituted or unsubstituted amino group ($NH_2$), a substituted or unsubstituted hydrocarbon group (R), a substituted or unsubstituted carboxylic group (ROOH), a substituted or unsubstituted ester group (ROOR), a substituted or unsubstituted alcohol group (ROH), a substituted or unsubstituted pyridyl group (Py), a substituted or unsubstituted ether group (ROR), a substituted or unsubstituted phenyl group (Bz), and a substituted or unsubstituted nitrooxy group ($ONO_2$).

In one embodiment, the organic electroluminescent material is a polymer formed by metal-organic frameworks.

In one embodiment, the hydroxyl group is a linear or branched alkyl group, a cycloalkyl group, a linear or branched alkenyl group, a cycloalkenyl group, a linear or branched alkynyl group, or an aromatic hydrocarbon group.

In one embodiment, L is any one selected from the following Chemical Formulas (1) to (6):

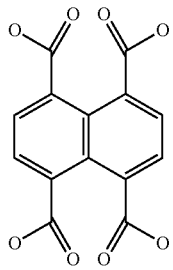

General Formula (1)

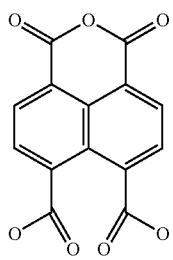

General Formula (2)

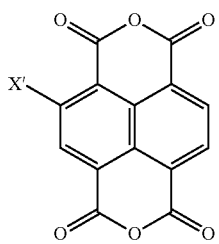

General Formula (3)

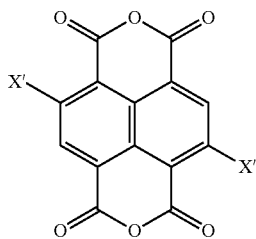

General Formula (4)

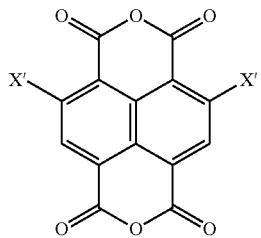

General Formula (5)

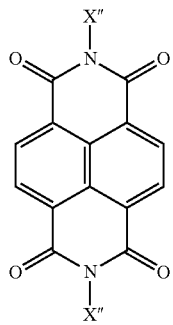

General Formula (6)

Wherein, X' is independently selected from a group consisting of a hydrogen atom, a fluorine atom, a chlorine atom, a bromine atom, a cyano group, an alkylthio group, a hydroxyl group, and an alkoxy group, X" is independently selected from a group consisting of a hydrogen atom, a hydroxyl group, a substituted or unsubstituted amino group, a substituted or unsubstituted hydrocarbon group, a substituted or unsubstituted carboxylic group, a substituted or unsubstituted ester group, a substituted or unsubstituted alcohol group, a substituted or unsubstituted pyridyl group, a substituted or unsubstituted ether group, a substituted or unsubstituted phenyl group, and a substituted or unsubstituted nitrooxy group.

In one embodiment, the organic electroluminescent material is $\{[Sr(ntca)(H_2O)_2] \cdot H_2O\}_n$.

To achieve the above objective, the present invention also discloses an organic electroluminescent device including a first electrode, a second electrode, and an organic luminescent unit. The organic luminescent unit is disposed between the first electrode and the second electrode and includes an organic electroluminescent material having a structure of the following General Formula (1):

$$\{[M(L)(H_2O)_x] \cdot (H_2O)_y\}_n \qquad \text{General Formula (1)}$$

Wherein, x is between 1 and 4, y is between 1 and 8, n is a positive integer, M is any one selected from a group consisting of beryllium (Be), strontium (Sr), and radium (Ra), and L is selected from a group consisting of a General Formula (2), a General Formula (3) and a General Formula (4):

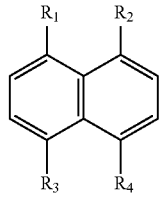

General Formula (2)

-continued

General Formula (3)

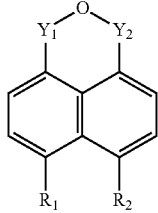

General Formula (4)

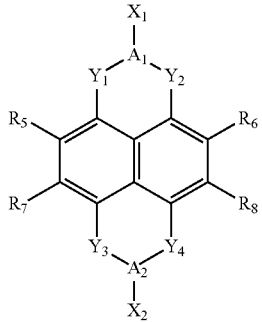

Wherein, $R_1$, $R_2$, $R_3$ and $R_4$ are each independently a carboxylic group. $Y_1$, $Y_2$, $Y_3$ and $Y_4$ are each independently a carbonyl group. $A_1$ and $A_2$ are each independently an oxygen atom or a nitrogen atom. $R_5$, $R_6$, $R_7$ and $R_8$ are each independently selected from a group consisting of a hydrogen atom, a fluorine atom, a chlorine atom, a bromine atom, a cyano group, an alkylthio group, a hydroxyl group, and an alkoxy group. $X_1$ and $X_2$ are each independently selected from a group consisting of a hydrogen atom, a hydroxyl group, a substituted or unsubstituted amino group, a substituted or unsubstituted hydrocarbon group, a substituted or unsubstituted carboxylic group, a substituted or unsubstituted ester group, a substituted or unsubstituted alcohol group, a substituted or unsubstituted pyridyl group, a substituted or unsubstituted ether group, a substituted or unsubstituted phenyl group, and a substituted or unsubstituted nitrooxy group.

In one embodiment, the first electrode comprises a carbon material layer selected from a group consisting of graphite, graphene and carbon nanotube.

In one embodiment, the first electrode further includes a transparent material layer selected from a group consisting of polycarbonate (PC), poly(methyl methacrylate) (PMMA), polyethylene terephthalate (PET), and polystyrene (PS).

In one embodiment, the organic luminescent unit further includes an electron transport layer.

In one embodiment, the organic electroluminescent material is $\{[Sr(ntca)(H_2O)_2].H_2O\}_n$.

As mentioned above, the organic electroluminescent material of General Formula (1) has a three dimensional structure consisting of metal ions and organic ligands. The organic electroluminescent material of General Formula (1) and the organic electroluminescent device containing the same can emit light of a continuous bandwidth between 400 nm and 750 nm, which is similar to the natural sun light, so that the emitted light is comfortable to human eyes. Accordingly, the organic electroluminescent material of General Formula (1) and the organic electroluminescent device containing the same are suitable for the high performance organic light emitting devices. Besides, the organic electroluminescent material of the invention does not contain the rare metals such as lanthanide metals, so that the organic electroluminescent device made by the organic electroluminescent material is not expensive and has good price competitiveness.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

Figure 1:
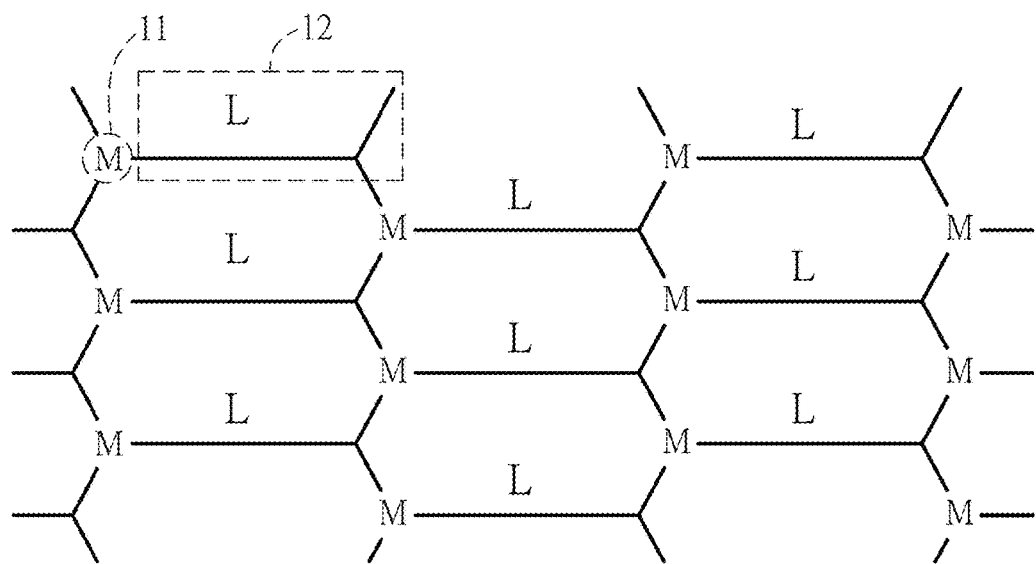
FIG. 1 is a schematic diagram showing the structure of an organic electroluminescent material according a first embodiment of the invention.

The present invention will be apparent from the following detailed description, which proceeds with reference to the accompanying drawings, wherein the same references relate to the same elements.

Organic Electroluminescent Material

An organic electroluminescent material according to a first embodiment of the invention is composed of metal-organic frameworks (MOFs) generated by the self-assembly reaction of alkaline earth metal and organic ligands. The organic electroluminescent material according to the first embodiment of the invention has the following General Formula (1):

$$\{[M(L)(H_2O)_x].(H_2O)_y\}_n \quad \text{General Formula (1)}$$

In the General Formula (1), x is between 1 and 4, y is between 1 and 8, n is a positive integer, and M is any one selected from a group consisting of beryllium (Be), strontium (Sr), and radium (Ra). L is selected from a group consisting of a General Formula (2), a General Formula (3) and a General Formula (4):

General Formula (2)

-continued

General Formula (3)

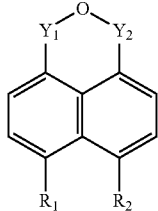

General Formula (4)

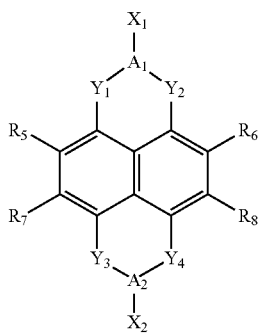

In the General Formula (2), the General Formula (3) and the General Formula (4), $R_1$, $R_2$, $R_3$ and $R_4$ are each independently a carboxylic group. $Y_1$, $Y_2$, $Y_3$ and $Y_4$ are each independently a carbonyl group. $A_1$ and $A_2$ are each independently an oxygen atom (O) or a nitrogen atom (N). $R_5$, $R_6$, $R_7$ and $R_8$ are each independently selected from a group consisting of a hydrogen atom (H), a fluorine atom (F), a chlorine atom (Cl), a bromine atom (Br), a cyano group (CN), an alkylthio group (SR), a hydroxyl group (OH), and an alkoxy group (OR). $X_1$ and $X_2$ are each independently selected from a group consisting of a hydrogen atom (H), a hydroxyl group (OH), a substituted or unsubstituted amino group ($NH_2$), a substituted or unsubstituted hydrocarbon group (R), a substituted or unsubstituted carboxylic group (ROOH), a substituted or unsubstituted ester group (ROOR), a substituted or unsubstituted alcohol group (ROH), a substituted or unsubstituted pyridyl group (Py), a substituted or unsubstituted ether group (ROR), a substituted or unsubstituted phenyl group (Bz), and a substituted or unsubstituted nitrooxy group ($ONO_2$).

The hydroxyl group is a linear or branched alkyl group, a cycloalkyl group, a linear or branched alkenyl group, a cycloalkenyl group, a linear or branched alkynyl group, or an aromatic hydrocarbon group. The linear alkyl group is a substituted or unsubstituted linear C1 to C12 alkyl group. The branched alkyl group is a substituted or unsubstituted branched C3 to C12 alkyl group. The cycloalkyl group is a substituted or unsubstituted C3 to C12 cycloalkyl group. The linear alkenyl group is a substituted or unsubstituted linear C2 to C12 alkenyl group. The branched alkenyl group is a substituted or unsubstituted branched C3 to C12 alkenyl group. The cycloalkenyl group is a substituted or unsubstituted C3 to C12 cycloalkenyl group. The linear alkynyl group is a substituted or unsubstituted linear C2 to C12 alkynyl group. The branched alkynyl group is a substituted or unsubstituted branched C3 to C12 alkynyl group. The aromatic hydrocarbon group is a substituted or unsubstituted C6 to C12 aromatic hydrocarbon group. The alkoxy group is a substituted or unsubstituted C1 to C12 alkoxy group. The alkylthio group is a substituted or unsubstituted C1 to C12 alkylthio group.

In the General Formula (1), L is an organic ligand. Preferably, L is any one selected from the following Chemical Formulas (1) to (6):

General Formula (1)

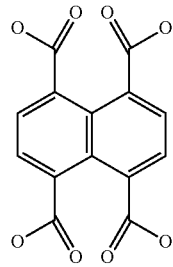

General Formula (2)

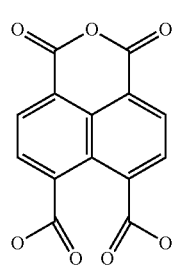

General Formula (3)

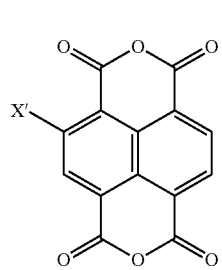

General Formula (4)

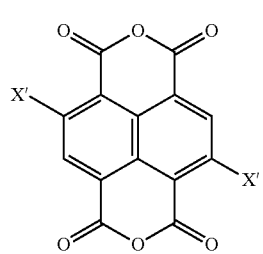

General Formula (5)

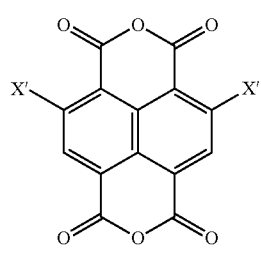

-continued

General Formula (6)

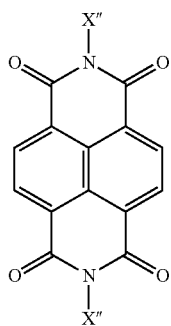

In the Chemical Formulas (1) to (6), X' is independently selected from a group consisting of a hydrogen atom (H), a fluorine atom (F), a chlorine atom (Cl), a bromine atom (Br), a cyano group (CN), an alkylthio group (SR), a hydroxyl group (OH), and an alkoxy group (OR).

X" is independently selected from a group consisting of a hydrogen atom (H), a hydroxyl group (OH), a substituted or unsubstituted amino group ($NH_2$), a substituted or unsubstituted hydrocarbon group (R), a substituted or unsubstituted carboxylic group (ROOH), a substituted or unsubstituted ester group (ROOR), a substituted or unsubstituted alcohol group (ROH), a substituted or unsubstituted pyridyl group (Py), a substituted or unsubstituted ether group (ROR), a substituted or unsubstituted phenyl group (Bz), and a substituted or unsubstituted nitrooxy group ($ONO_2$).

Herein, L can be 1,3-Dioxo-1H,3H-naphtho[1,8-c,d]pyran-6,7-dicarboxylic acid (Chemical Formula (2), or named as 1,4,5,8-naphthalenetetracarboxylate 1,8-monoanhydride (ncta)), naphthalene-1,4,5,8-tetracarboxylic acid (Chemical Formula (1) (ntc)), Isochromeno[6,5,4-def]isochromene-1,3,6,8-tetrone (Chemical Formula (3), wherein X' is a hydrogen atom (H)), or N,N'—H Benzo[lmn][3,8]phenanthroline-1,3,6,8(2H,7H)-tetrone (Chemical Formula (6), wherein X" is a hydrogen atom (H)) and its derivatives (e.g. N,N'-hydroxyl Benzo[lmn][3,8]phenanthroline-1,3,6,8(2H,7H)-tetrone (Chemical Formula (6), wherein X" is a hydroxyl group (OH))).

As mentioned above, the organic electroluminescent material of the embodiment is a polymer of metal-organic frameworks, each of which is formed by the combination of alkaline earth metal and organic ligand. The core of the organic ligand is a naphthalene ring, and the organic ligand further includes at least one anhydride group or carboxylic group. FIG. 1 is a schematic diagram showing the structure of an organic electroluminescent material according a first embodiment of the invention. As shown in FIG. 1, the organic electroluminescent material of the first embodiment is a polymer of metal-organic frameworks, which has a three dimensional structure composed of metal ions 11 and organic ligands 12. The polymer of metal-organic frameworks is a porous material. The connection between the organic ligands 12 and the metal ions 11 can be provided by the oxygen of the anhydride group and/or carboxylic group of the organic ligands 12. In the self-assembly reaction, the alkaline earth metal is added to open the anhydride groups of the organic ligands 12 to form carboxylic groups, or to close the carboxylic groups at the same side of the organic ligands 12 so as to form anhydride groups. Preferably, the organic electroluminescent material of the first embodiment is $\{[Sr(ntca)(H_2O)_2] \cdot H_2O\}_n$.

Figure 2:
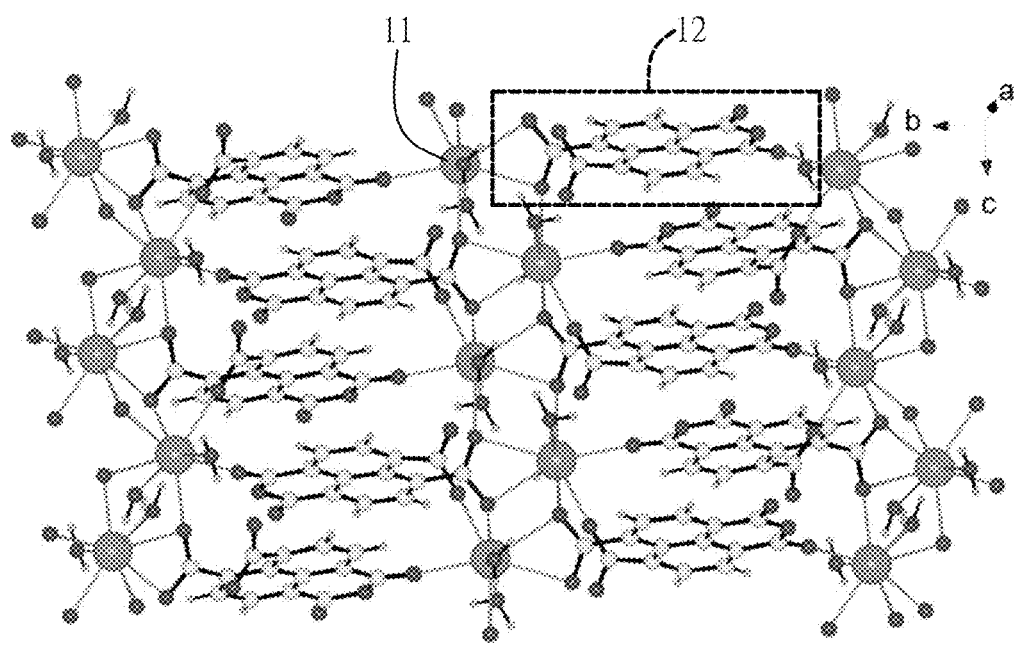
FIG. 2 is a schematic diagram showing the structure of an organic electroluminescent material of $\{[Sr(ntca)(H_2O)_2].H_2O\}_n$ according the first embodiment of the invention.

FIG. 2 is a schematic diagram showing the structure of an organic electroluminescent material of $\{[Sr(ntca)(H_2O)_2] \cdot H_2O\}_n$ according the first embodiment of the invention. As shown in FIG. 2, metal ions 11 ($Sr^{2+}$) have eight coordination for bonding to six oxygen atoms and two water molecules ($H_2O$) of the anhydride groups and carboxylic groups of four organic ligands 12. The synthesizing method and lighting profile of the organic electroluminescent material of the first embodiment will be described in the following synthesizing example and experimental example 1.

Organic Electroluminescent Device

Figure 3:
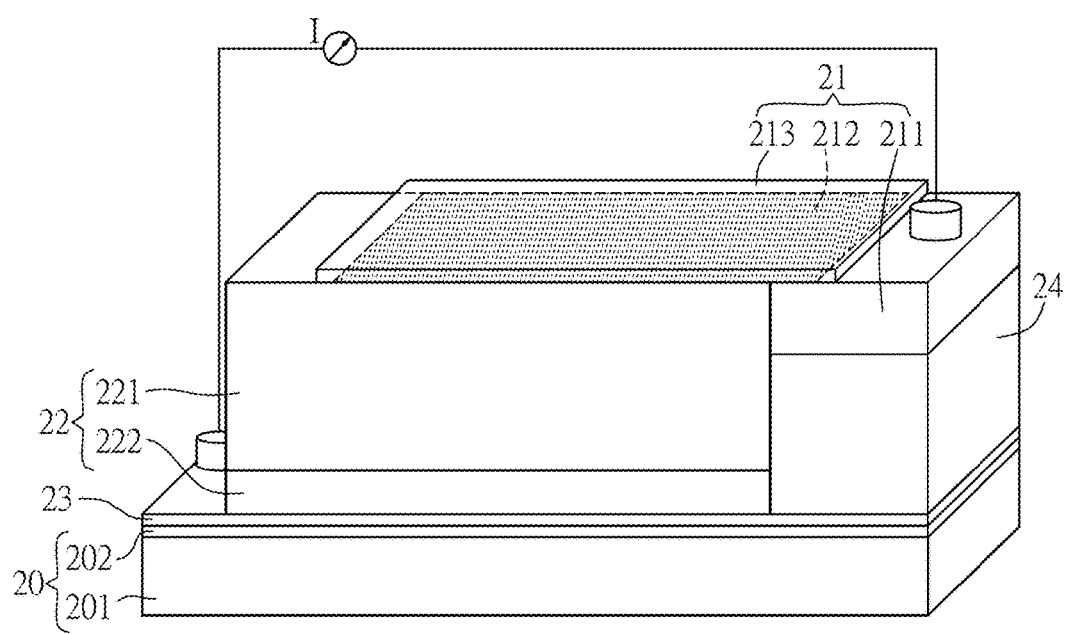
FIG. 3 is a schematic diagram showing an organic electroluminescent device according a second embodiment of the invention.

FIG. 3 is a schematic diagram showing an organic electroluminescent device according a second embodiment of the invention. As shown in FIG. 3, the organic electroluminescent device 2 includes a first electrode 21, a second electrode 23, and an organic luminescent unit 22. The organic luminescent unit 22 is disposed between the first electrode 21 and the second electrode 23. The organic luminescent unit 22 includes an organic electroluminescent material having a structure of the following General Formula (1):

$$\{[M(L)(H_2O)_x] \cdot (H_2O)_y\}_n \quad \text{General Formula (1)}$$

The organic electroluminescent material of the General Formula (1) can be referred to the material of the first embodiment, which is a polymer of metal-organic frameworks having a three dimensional structure composed of metal ions and organic ligands. The polymer of metal-organic frameworks is a porous material.

In the General Formula (1), x is between 1 and 4, y is between 1 and 8, n is a positive integer, and M is alkaline earth metal such as beryllium (Be), strontium (Sr), or radium (Ra). L is selected from a group consisting of a General Formula (2), a General Formula (3) and a General Formula (4):

General Formula (2)

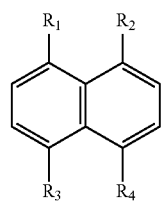

General Formula (3)

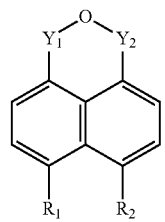

General Formula (4)

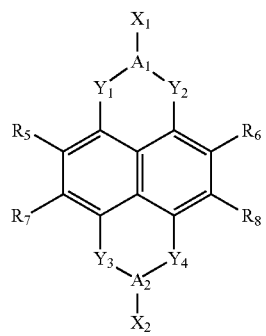

In the General Formula (2), the General Formula (3) and the General Formula (4), $R_1$, $R_2$, $R_3$ and $R_4$ are each independently a carboxylic group. $Y_1$, $Y_2$, $Y_3$ and $Y_4$ are each independently a carbonyl group. $A_1$ and $A_2$ are each independently an oxygen atom (O) or a nitrogen atom (N). $R_5$, $R_6$, $R_7$ and $R_8$ are each independently selected from a group consisting of a hydrogen atom (H), a fluorine atom (F), a chlorine atom (Cl), a bromine atom (Br), a cyano group (CN), an alkylthio group (SR), a hydroxyl group (OH), and an alkoxy group (OR). $X_1$ and $X_2$ are each independently selected from a group consisting of a hydrogen atom (H), a hydroxyl group (OH), a substituted or unsubstituted amino group ($NH_2$), a substituted or unsubstituted hydrocarbon group (R), a substituted or unsubstituted carboxylic group (ROOH), a substituted or unsubstituted ester group (ROOR), a substituted or unsubstituted alcohol group (ROH), a substituted or unsubstituted pyridyl group (Py), a substituted or unsubstituted ether group (ROR), a substituted or unsubstituted phenyl group (Bz), and a substituted or unsubstituted nitrooxy group ($ONO_2$).

The hydroxyl group is a linear or branched alkyl group, a cycloalkyl group, a linear or branched alkenyl group, a cycloalkenyl group, a linear or branched alkynyl group, or an aromatic hydrocarbon group. The linear alkyl group is a substituted or unsubstituted linear C1 to C12 alkyl group. The branched alkyl group is a substituted or unsubstituted branched C3 to C12 alkyl group. The cycloalkyl group is a substituted or unsubstituted C3 to C12 cycloalkyl group. The linear alkenyl group is a substituted or unsubstituted linear C2 to C12 alkenyl group. The branched alkenyl group is a substituted or unsubstituted branched C3 to C12 alkenyl group. The cycloalkenyl group is a substituted or unsubstituted C3 to C12 cycloalkenyl group. The linear alkynyl group is a substituted or unsubstituted linear C2 to C12 alkynyl group. The branched alkynyl group is a substituted or unsubstituted branched C3 to C12 alkynyl group. The aromatic hydrocarbon group is a substituted or unsubstituted C6 to C12 aromatic hydrocarbon group. The alkoxy group is a substituted or unsubstituted C1 to C12 alkoxy group. The alkylthio group is a substituted or unsubstituted C1 to C12 alkylthio group.

In the General Formula (1), L is an organic ligand. Preferably, L is any one selected from the following Chemical Formulas (1) to (6):

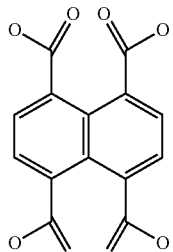

General Formula (1)

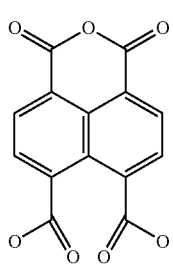

General Formula (2)

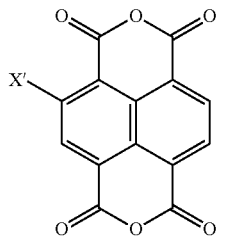

General Formula (3)

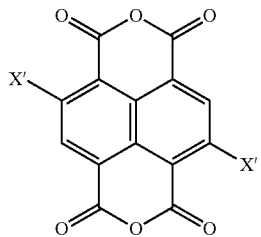

General Formula (4)

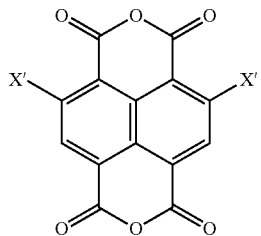

General Formula (5)

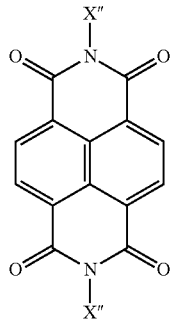

General Formula (6)

In the Chemical Formulas (1) to (6), X' is independently selected from a group consisting of a hydrogen atom (H), a fluorine atom (F), a chlorine atom (Cl), a bromine atom (Br), a cyano group (CN), an alkylthio group (SR), a hydroxyl group (OH), and an alkoxy group (OR).

X" is independently selected from a group consisting of a hydrogen atom (H), a hydroxyl group (OH), a substituted or unsubstituted amino group ($NH_2$), a substituted or unsubstituted hydrocarbon group (R), a substituted or unsubstituted carboxylic group (ROOH), a substituted or unsubstituted ester group (ROOR), a substituted or unsubstituted alcohol group (ROH), a substituted or unsubstituted pyridyl group (Py), a substituted or unsubstituted ether group (ROR), a substituted or unsubstituted phenyl group (Bz), and a substituted or unsubstituted nitrooxy group ($ONO_2$). The substituted groups of the above-mentioned compounds are the same as those disclosed in the first embodiment, so the detailed description thereof will be omitted.

Herein, L can be 1,3-Dioxo-1H,3H-naphtho[1,8-c,d]pyran-6,7-dicarboxylic acid (Chemical Formula (2), or named as 1,4,5,8-naphthalenetetracarboxylate 1,8-monoanhydride (ncta)), naphthalene-1,4,5,8-tetracarboxylic acid (Chemical Formula (1) (ntc)), Isochromeno[6,5,4-def]isochromene-1,3,6,8-tetrone (Chemical Formula (3), wherein X' is a hydrogen atom (H)), or N,N'—H Benzo[lmn][3,8]phenanthroline-1,3,6,8(2H,7H)-tetrone (Chemical Formula (6), wherein X" is a hydrogen atom (H)) and its derivatives (e.g. N,N'-hydroxyl Benzo[lmn][3,8]phenanthroline-1,3,6,8 (2H,7H)-tetrone (Chemical Formula (6), wherein X" is a hydroxyl group (OH))). Preferably, the organic electroluminescent material of the organic luminescent unit 22 is ${[Sr(ntca)(H_2O)_2].H_2O}_n$.

The first electrode 21 and/or the second electrode 23 can be made of transparent electrode materials, metals or other suitable conductive materials. In more detailed, at least one of the first electrode 21 and the second electrode 23 has a region formed by transparent material. Accordingly, the light emitted by the organic luminescent unit 22 can be outputted through the transparent region of the electrode, so that the organic electroluminescent material device 2 can emit light. The above-mentioned transparent electrode material can be ITO.

The first electrode 21 preferably includes a first metal electrode layer 211, a carbon material layer 212 and a transparent material layer 213. The transparent material layer 213, the carbon material layer 212 and the first metal electrode layer 211 are preferably disposed above the organic luminescent unit 22 in order. The first metal electrode layer 211 can be any conductive material, and preferably silver. The carbon material layer 212 can be selected from a group consisting of graphite, graphene and carbon nanotube, or their combinations. The transparent material layer 213 can be polycarbonate (PC), poly(methyl methacrylate) (PMMA), polyethylene terephthalate (PET), or polystyrene (PS). Since the organic electroluminescent material of the organic luminescent unit 22 is a porous material, the configuration of the carbon material layer 212 allows the carriers to be injected into the organic luminescent layer 221 more quickly and protects the porous organic luminescent layer 221 from having short circuit with other deposited electrodes. The carbon material layer 212 is preferably a single layer graphene (SLG). The transparent material layer 213 can protect the carbon material layer 212, which is disposed between the transparent material layer 213 and the organic luminescent unit 22 from the environmental temperature and moisture. This configuration can make the organic electroluminescent device 2 more stable and having longer lifetime.

The second electrode 23 can be any conductive material, and preferably silver. The thickness of the second electrode 23 is between 50 nm and 200 nm, and is preferably 100 nm.

The organic luminescent unit 22 preferably includes an organic luminescent layer 221 and an electron transport layer 222. The organic luminescent layer 221 includes the above-mentioned organic electroluminescent material and has a thickness of 0.2-1.5 μm. Preferably, the electron transport layer 222 is made of Zinc oxide (ZnO) and has a thickness of 50-200 nm (preferably 140 nm). The configuration of the electron transport layer 222 can assist the transmission of electrons, thereby optimizing the quantum effect of the organic electroluminescent material. Besides, the organic luminescent unit 22 may further include a hole transport layer, an electron blocking layer, and an electron injection layer. Herein, the hole transport layer, the electron blocking layer, the organic luminescent layer, the electron transport layer 222 and the electron injection layer are disposed in order from the top to the bottom.

The hole transport layer can be made of 1,1-Bis[4-[N,N'-di(p-tolyl)amino]phenyl]cyclohexane (TAPC), N,N-bis-(1-naphthyl)-N,N-diphenyl-1,1-biphenyl-4,4-diamine (NPB), or N—N'-diphenyl-N—N'-bis(3-methylphenyl)-[1-1'-biphenyl]-4-4'-diamine (TPD). In this embodiment, the hole transport layer can increase the speed to inject the holes from the first electrode 21 to the organic luminescent layer, and decrease the driving voltage of the organic electroluminescent device 2.

The electron blocking layer can be made of N,N'-dicarbazolyl-3,5-benzene (mCP) or any material with low electron affinity and further increase the speed to transport the holes from the hole transport layer to the organic luminescent layer 221. Besides, the electron transport layer 222 can also be made of metal complex such as Tris-(8-hydroxyquinoline)aluminum ($Alq_3$), bis(10-hydroxybenzo-[h]quinolinato)beryllium ($BeBq_2$), or heterocyclic compounds such as 2-(4-Biphenylyl)-5-(4-tert-butylphenyl)-1,3,4-oxadiazole (PBD), 3-(4-Biphenylyl)-4-phenyl-5-tert-butylphenyl-1,2,4-triazole (TAZ), 2,2',2"-(1,3,5-Benzinetriyl)-tris(1-phenyl-1-H-benzimidazole) (TPBI), diphenylbis(4-(pyridin-3-yl)phenyl)silane (DPPS), 3,3'-[5'-[3-(3-Pyridinyl)phenyl][1,1':3',1"-terphenyl]-3,3"-diyl]bispyridine (TmPyPB), or the likes. To be noted, the invention is not limited to the above materials. The configuration of the electron transport layer 222 can assist to transport the electrons from the second electrode 23 to the organic luminescent layer 221, thereby increasing the electron transporting speed. The electron injection layer can be made of LiF.

To be noted, the structure of the organic electroluminescent device 2 is not limited to the above disclosed aspect, which is for an illustration only.

The synthesis of the organic electroluminescent material of the General Formula (1) will be described in the following synthesizing example.

Synthesizing Example: The Synthesis of a Polymer ${[Sr(ntca)(H_2O)_2].H_2O}_n$ 1,4,5,8-naphthalenetertacarboxylic acid hydrate ($H_4$ntc, 30.4 mg, 0.10 mmol), $Sr(NO_3)_2$ (42.4 mg, 0.20 mmol), EtOH (3 mL) and $H_2O$ (1 mL) are mixed in a Teflon-lined stainless steel Parr acid digestion bomb. The mixture is heated to 120° C. for performing a self-assembly reaction. After heated for 3 days, the mixture is slowly cooled down to room temperature, wherein the cooling speed is about 6° C. per hour. The solution is filtered by suction filtration to collect the solid, which is then washed by water and dried in room temperature. The colorless crystal compound 1 (${[Sr(ntca)(H_2O)_2].H_2O}_n$, 13.5 mg, yield 32%) is then obtained. (calcd (%) for $C_{28}H_{20}O_{20}Sr_2$: C, 39.64; H, 2.33. Found: C, 39.49; H, 2.37).

After the thermogravimetric analysis, the compound 1 is still stable under 335° C.

Experimental Example 1: Optical Characteristics of Compound 1 (${[Sr(ntca)(H_2O)_2].H_2O}_n$)

After excited by pulse laser (27 μW to 29 μW, 266 nm), the compound 1 has continuous bandwidth white light spectrum in visible light range (400 nm to 750 nm). The strongest light intensity is around 550 nm, and the quantum yield is about 10%.

Figure 4:
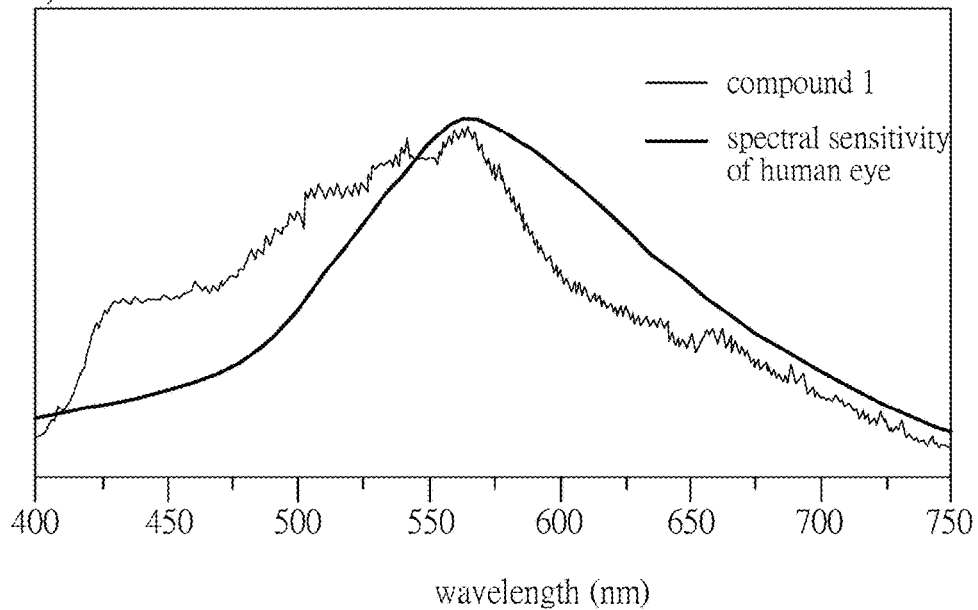
FIG. 4 is a schematic chart showing the spectral sensitivity of human eye and the photoluminescence spectrum of the compound 1 of experimental example 1.
Figure 5:
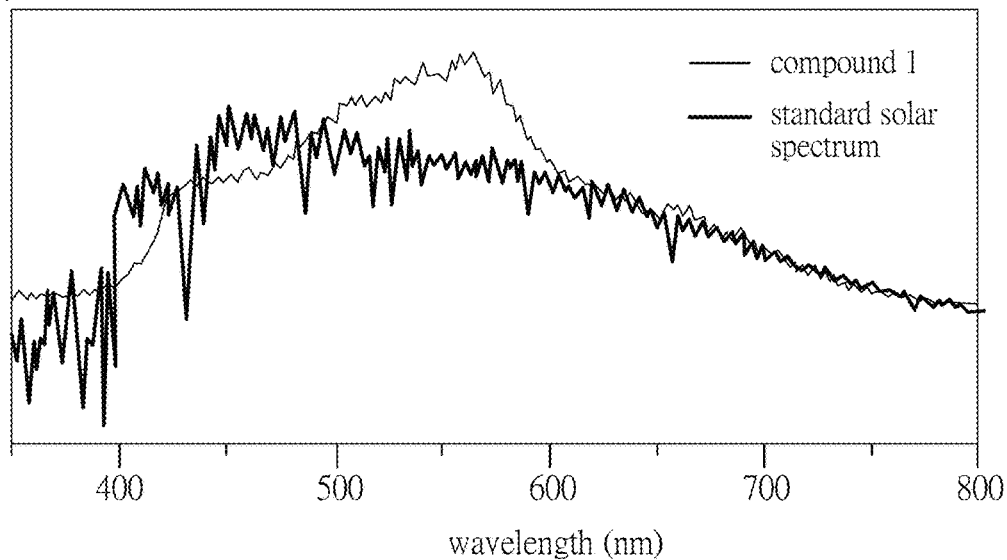
FIG. 5 is a schematic chart showing the standard solar spectrum and the electroluminescence spectrum of the compound 1 of experimental example 1.

FIG. 4 is a schematic chart showing the spectral sensitivity of human eye and the photoluminescence spectrum of the compound 1 of experimental example 1, and FIG. 5 is a schematic chart showing the standard solar spectrum and the electroluminescence spectrum of the compound 1 of experimental example 1. As shown in FIGS. 4 and 5, the continuous bandwidth white light spectrum in visible light range (400 nm to 750 nm) of the compound 1 is similar to that of the spectral sensitivity of human eye, which has the strongest light intensity around 550 nm. Besides, the waveform of electroluminescence spectrum of compound 1 is similar to that of standard solar spectrum. As a result, the light emitted by the compound 1 is very comfortable to human eyes and is similar to the natural sun light, so that the compound 1 is suitable for manufacturing the high performance organic electroluminescent material and device.

Experimental Example 2: Test for the Organic Electroluminescent Device 2 Containing the Compound 1

The structure of the organic electroluminescent device 2 containing the compound 1 is shown in FIG. 3. At first, a layer of silver is plated on the surface of a silicon substrate 20, which includes a layer of polycrystalline silicon 201 (p-Si) and silicon dioxide 202, and the silver layer has a thickness of about 100 nm and is configured as the second electrode 23. Then, a layer of ZnO is plated on the surface of the silver electrode, and the ZnO layer has a thickness of about 100 nm. The compound 1 is drop coated on the ZnO layer to form the organic luminescent layer 221, which has a thickness of about 0.2-1.5 µm. Finally, a single layer graphene (SLG) and a layer of PMMA (poly(methyl methacrylate) are disposed on the organic luminescent layer 221 in order and are configured as a carbon material layer 212 and a transparent material layer 213. The first metal electrode layer 211 of the first electrode 21 is also a silver electrode. The carbon material layer 212 and the transparent material layer 213 are optical transparent. In addition, a $SiO_2$ layer 24 is formed between the first electrode 21 and the second electrode 23 and aside the organic luminescent layer 221 and the ZnO layer (the electron transport layer 222).

When applying 8 Volts to the organic electroluminescent device 2 having an organic luminescent layer 221 containing the compound 1, the organic electroluminescent device 2 is still very stable.

Figure 6:
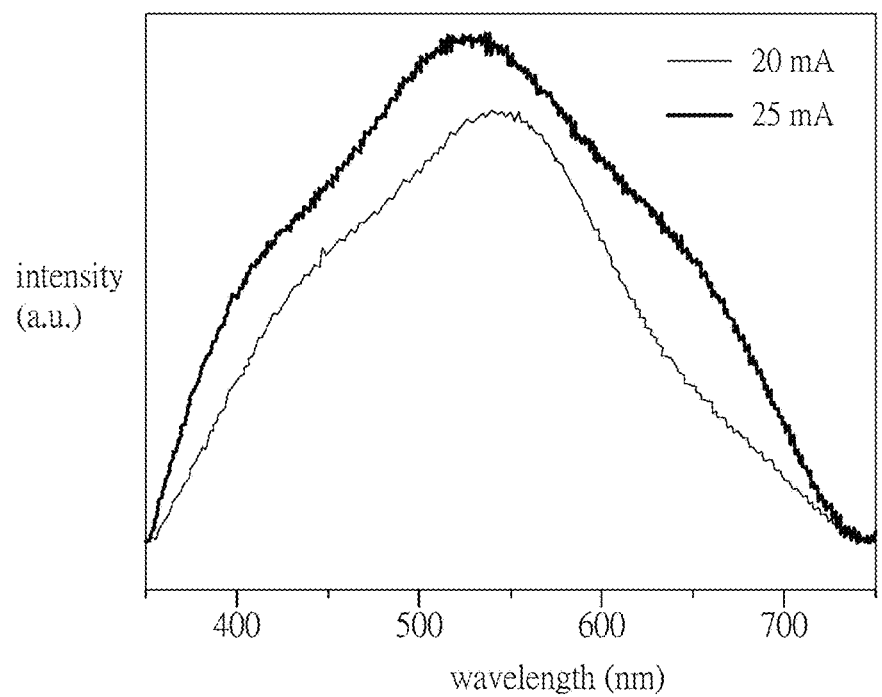
FIG. 6 is a schematic chart showing the electroluminescence spectrum of the organic electroluminescent device when applying current thereto in the experimental example 2.
Figure 7:
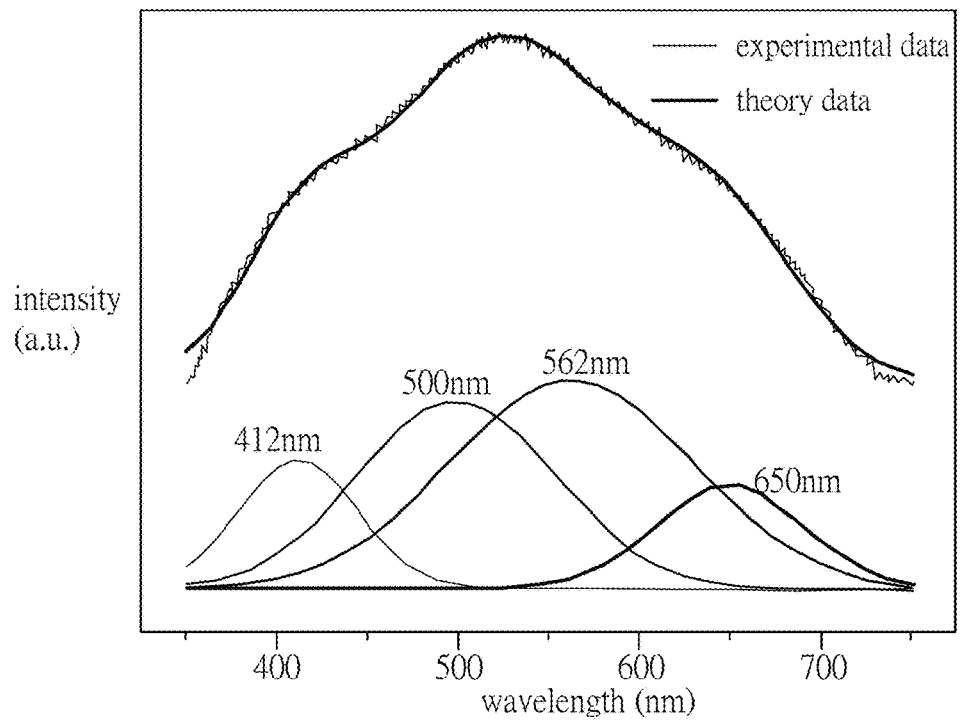
FIG. 7 is a schematic chart showing the electroluminescence spectrum and the deconvoluted spectrum of the organic electroluminescent device when applying the current of 25 mA thereto in the experimental example 2.

FIG. 6 is a schematic chart showing the electroluminescence spectrum of the organic electroluminescent device 2 when applying current (20 mA and 25 mA) thereto in the experimental example 2. Similar to the lighting profile of the compound 1, the maximum intensity of the wavelength $\lambda_{EL(max)}$ of the electroluminescence spectrum of the organic electroluminescent device 2 is about 530 nm to 540 nm, which is close to the most sensitive wavelength of human eyes (555 nm). FIG. 7 is a schematic chart showing the electroluminescence spectrum and the deconvoluted spectrum of the organic electroluminescent device when applying the current of 25 mA thereto in the experimental example 2. As shown in FIG. 7, the electroluminescence spectrum of the organic electroluminescent device 2 is mainly composed of the excited light caused by four energy transitions. The light of wavelength 410 nm is caused by the energy transition of interligand (L-L), the light of wavelengths 506 nm and 644 nm is caused by the energy transition of intermetallic (M-M), and the light of wavelength 560 nm is caused by the energy transition of metal to ligand charge transfer (MLCT).

Figure 8:
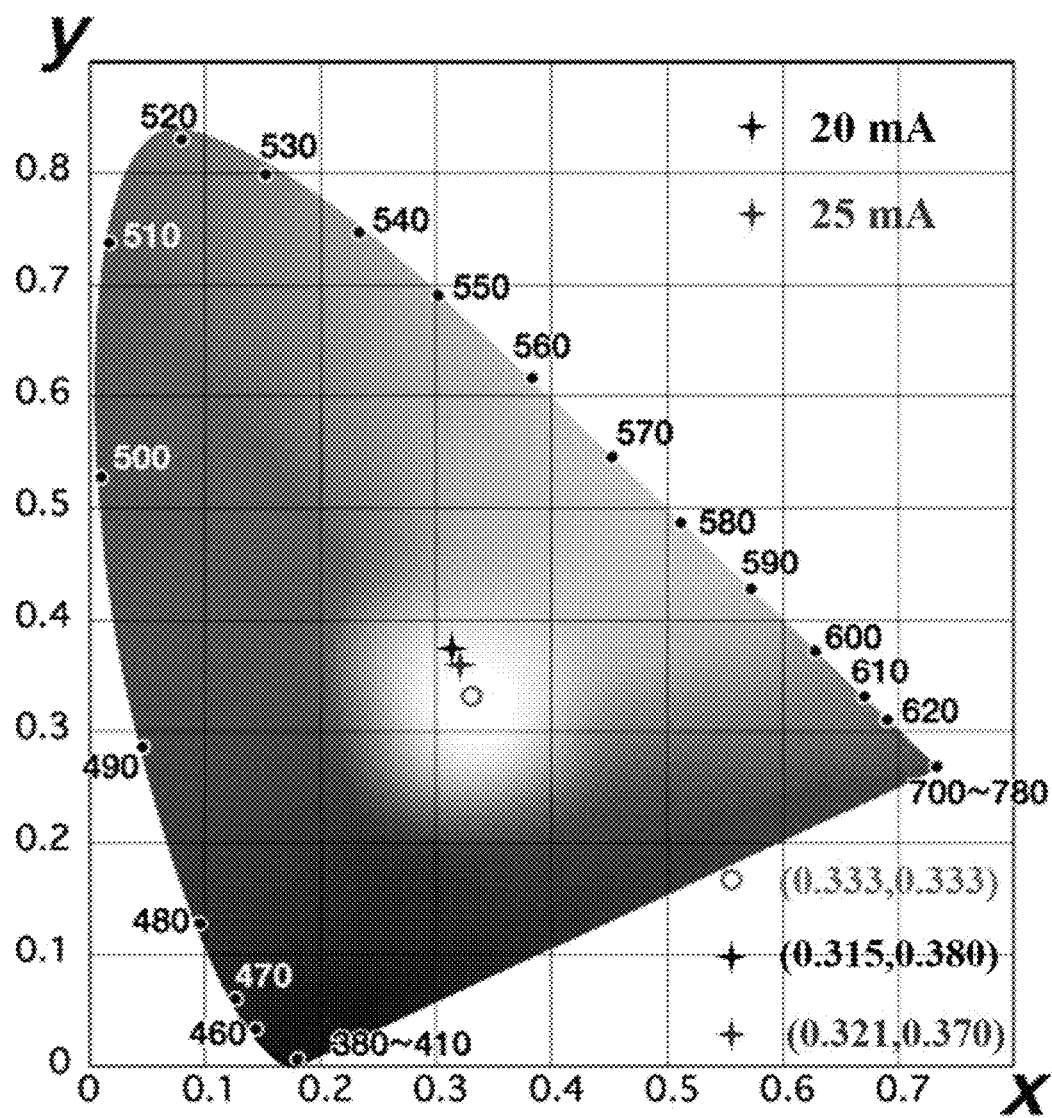
FIG. 8 is a chromaticity diagram of the organic electroluminescent device of the experimental example 2.

FIG. 8 is a chromaticity diagram (CIE (Commission Internationale de L'Éclairage) XY chromaticity diagram) of the organic electroluminescent device 2 of the experimental example 2, which has an organic luminescent layer 221 containing the compound 1. As shown in FIG. 8, after applying 20 mA and 25 mA current to the organic electroluminescent device 2, the coordinates of the light are (0.315, 0.380) and (0.321, 0.370), which are very close to the white light coordinates (0.333, 0.333). The color temperature thereof is about 5500K. As a result, the white light emitted by the organic electroluminescent device 2 is very similar to the natural sun light, so the organic electroluminescent material of the invention is suitable for manufacturing the high performance organic electroluminescent device.

In addition, the experimental example also discloses that the compound 1 ($\{[Sr(ntca)(H_2O)_2].H_2O\}_n$), which is composed of the metal-organic frameworks, has good electrical conductivity, so it is an excellent organic electroluminescent material.

In summary, the organic electroluminescent material of General Formula (1) has a three dimensional structure consisting of metal ions and organic ligands. The organic electroluminescent material of General Formula (1) and the organic electroluminescent device containing the same can emit light of a continuous bandwidth between 400 nm and 750 nm, which is similar to the natural sun light, so that the emitted light is comfortable to human eyes. Accordingly, the organic electroluminescent material of General Formula (1) and the organic electroluminescent device containing the same are suitable for the high performance organic light emitting devices. Besides, the organic electroluminescent material of the invention does not contain the rare metals such as lanthanide metals, so that the organic electroluminescent device made by the organic electroluminescent material is not expensive and has good price competitiveness.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An organic electroluminescent material having a structure of the following General Formula (1), $$\{[M(L)(H_2O)_x].(H_2O)_y\}_n \qquad \text{General Formula (1)}$$

wherein x is between 1 and 4, y is between 1 and 8, n is a positive integer, M is any one selected from a group consisting of beryllium (Be), strontium (Sr), and radium (Ra), and L is selected from a group consisting of a General Formula (2), a General Formula (3) and a General Formula (4):

General Formula (2)

General Formula (3)

-continued

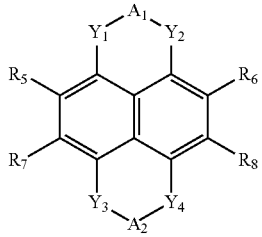
General Formula (4)

wherein, $R_1$, $R_2$, $R_3$ and $R_4$ are each independently a carboxylic group;
$Y_1$, $Y_2$, $Y_3$ and $Y_4$ are each independently a carbonyl group;
$A_1$ and $A_2$ are each independently an oxygen atom or a nitrogen atom, when $A_1$ and $A_2$ are nitrogen atoms, $A_1$ and $A_2$ respectively bind with $X_1$ and $X_2$, wherein $X_1$ and $X_2$ are each independently selected from a group consisting of a hydrogen atom, a hydroxyl group, a substituted or unsubstituted amino group, a substituted or unsubstituted hydrocarbon group, a substituted or unsubstituted carboxylic group, a substituted or unsubstituted ester group, a substituted or unsubstituted alcohol group, a substituted or unsubstituted pyridyl group, a substituted or unsubstituted ether group, a substituted or unsubstituted phenyl group, and a substituted or unsubstituted nitrooxy group; and
$R_5$, $R_6$, $R_7$ and $R_8$ are each independently selected from a group consisting of a hydrogen atom, a fluorine atom, a chlorine atom, a bromine atom, a cyano group, an alkylthio group, a hydroxyl group, and an alkoxy group.

2. The organic electroluminescent material of claim 1, which is a polymer formed by metal-organic frameworks.

3. The organic electroluminescent material of claim 1, wherein the hydrocarbon group is a linear or branched alkyl group, a cycloalkyl group, a linear or branched alkenyl group, a cycloalkenyl group, a linear or branched alkynyl group, or an aromatic hydrocarbon group.

4. The organic electroluminescent material of claim 1, wherein L is any one selected from the following Chemical Formulas (1) to (6):

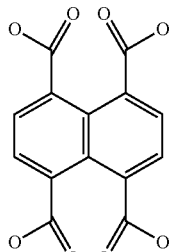
General Formula (1)

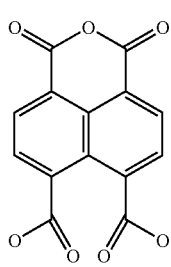
General Formula (2)

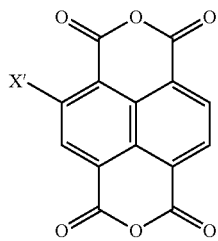
General Formula (3)

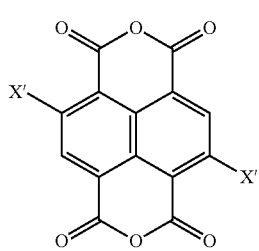
General Formula (4)

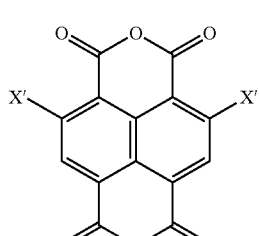
General Formula (5)

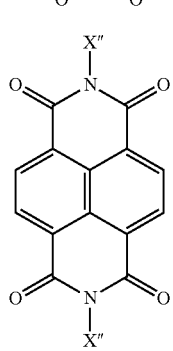
General Formula (6)

wherein, X' is independently selected from a group consisting of a hydrogen atom, a fluorine atom, a chlorine atom, a bromine atom, a cyano group, an alkylthio group, a hydroxyl group, and an alkoxy group, X" is independently selected from a group consisting of a hydrogen atom, a hydroxyl group, a substituted or unsubstituted amino group, a substituted or unsubstituted hydrocarbon group, a substituted or unsubstituted carboxylic group, a substituted or unsubstituted ester group, a substituted or unsubstituted alcohol group, a substituted or unsubstituted pyridyl group, a substituted or unsubstituted ether group, a substituted or unsubstituted phenyl group, and a substituted or unsubstituted nitrooxy group.

5. The organic electroluminescent material of claim 3, which is $\{[Sr(ntca)(H_2O)_2].H_2O\}_n$.

6. An organic electroluminescent device, comprising:
a first electrode;
a second electrode; and
an organic luminescent unit disposed between the first electrode and the second electrode and comprising an organic electroluminescent material having a structure of the following General Formula (1), $$\{[M(L)(H_2O)_x].(H_2O)_y\}_n \quad \text{General Formula (1)}$$

wherein x is between 1 and 4, y is between 1 and 8, n is a positive integer, M is any one selected from a group consisting of beryllium (Be), strontium (Sr), and radium (Ra), and L is selected from a group consisting of a General Formula (2), a General Formula (3) and a General Formula (4):

General Formula (2)

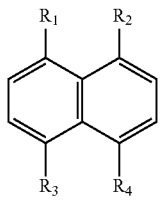

General Formula (3)

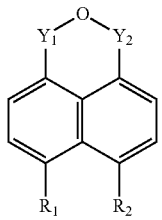

General Formula (4)

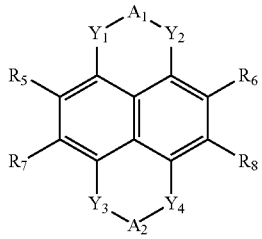

wherein, $R_1$, $R_2$, $R_3$ and $R_4$ are each independently a carboxylic group;

$Y_1$, $Y_2$, $Y_3$ and $Y_4$ are each independently a carbonyl group;

$A_1$ and $A_2$ are each independently an oxygen atom or a nitrogen atom, when $A_1$ and $A_2$ are nitrogen atoms, $A_1$ and $A_2$ respectively bind with $X_1$ and $X_2$, wherein $X_1$ and $X_2$ are each independently selected from a group consisting of a hydrogen atom, a hydroxyl group, a substituted or unsubstituted amino group, a substituted or unsubstituted hydrocarbon group, a substituted or unsubstituted carboxylic group, a substituted or unsubstituted ester group, a substituted or unsubstituted alcohol group, a substituted or unsubstituted pyridyl group, a substituted or unsubstituted ether group, a substituted or unsubstituted phenyl group, and a substituted or unsubstituted nitrooxy group; and $R_5$, $R_6$, $R_7$ and $R_8$ are each independently selected from a group consisting of a hydrogen atom, a fluorine atom, a chlorine atom, a bromine atom, a cyano group, an alkylthio group, a hydroxyl group, and an alkoxy group.

7. The organic electroluminescent device of claim 6, wherein the organic electroluminescent material is $\{[Sr(ntca)(H_2O)_2].H_2O\}_n$.

8. The organic electroluminescent device of claim 6, wherein the first electrode comprises a carbon material layer selected from a group consisting of graphite, graphene and carbon nanotube.

9. The organic electroluminescent device of claim 8, wherein the organic electroluminescent material is $\{[Sr(ntca)(H_2O)_2].H_2O\}_n$.

10. The organic electroluminescent device of claim 8, wherein the first electrode further comprises a transparent material layer selected from a group consisting of polycarbonate (PC), poly(methyl methacrylate) (PMMA), polyethylene terephthalate (PET), and polystyrene (PS).

11. The organic electroluminescent device of claim 10, wherein the organic electroluminescent material is $\{[Sr(ntca)(H_2O)_2].H_2O\}_n$.

12. The organic electroluminescent device of claim 6, wherein the organic luminescent unit further comprises an electron transport layer.

13. The organic electroluminescent device of claim 12, wherein the organic electroluminescent material is $\{[Sr(ntca)(H_2O)_2].H_2O\}_n$.

* * * * *